(12) United States Patent
Asano et al.

(10) Patent No.: US 6,741,334 B2
(45) Date of Patent: May 25, 2004

(54) EXPOSURE METHOD, EXPOSURE SYSTEM AND RECORDING MEDIUM

(75) Inventors: Masafumi Asano, Yokohama (JP); Tadahito Fujisawa, Tokyo (JP); Kyoko Izuha, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 10/026,757

(22) Filed: Dec. 27, 2001

(65) Prior Publication Data
US 2002/0087943 A1 Jul. 4, 2002

(30) Foreign Application Priority Data
Dec. 28, 2000 (JP) ........................................ 2000-399765

(51) Int. Cl.[7] .............................................. G03B 27/32
(52) U.S. Cl. ........................................... 355/77; 355/53
(58) Field of Search ........................................ 355/53, 77

(56) References Cited

U.S. PATENT DOCUMENTS 5,329,336 A * 7/1994 Hirano et al. ................... 355/53
5,650,840 A * 7/1997 Taniguchi ...................... 250/548
6,078,381 A * 6/2000 Suzuki .......................... 355/53
6,115,107 A * 9/2000 Nishi ............................. 355/53

FOREIGN PATENT DOCUMENTS

| JP | 2-2103 | 1/1990 |
| JP | 8-335548 | 12/1996 |

* cited by examiner

Primary Examiner—Russell Adams
Assistant Examiner—D. Ben Esplin
(74) Attorney, Agent, or Firm—Finnegan, Henderson, Farabow, Garrett & Dunner, L.L.P.

(57) ABSTRACT

An exposure method is disclosed, which comprises exposing a light on a photomask having a mask pattern, in an exposing device, receiving in the exposing device the light which passed through the photomask to observe an optical image of the mask pattern based on the received light, deciding an optimum exposure condition based on the optical image of the mask pattern to form a predetermined resist pattern, and exposing a light on a photoresist film formed on a wafer via the photomask based on the optimum exposure condition.

14 Claims, 6 Drawing Sheets

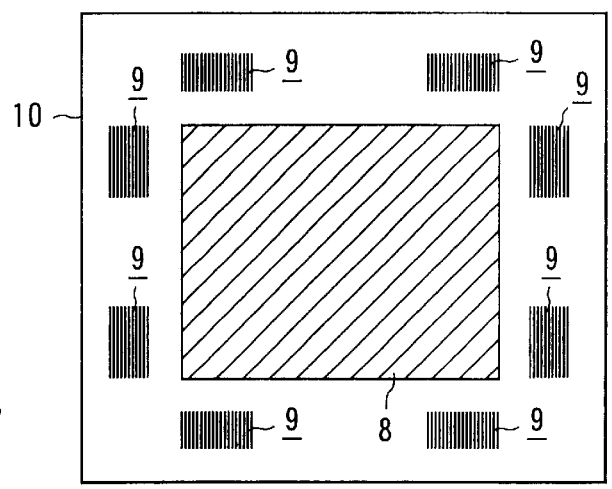
FIG. 7
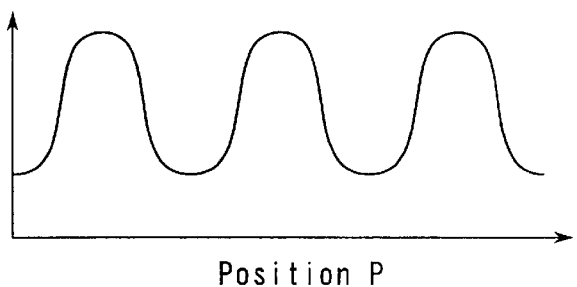
FIG. 8
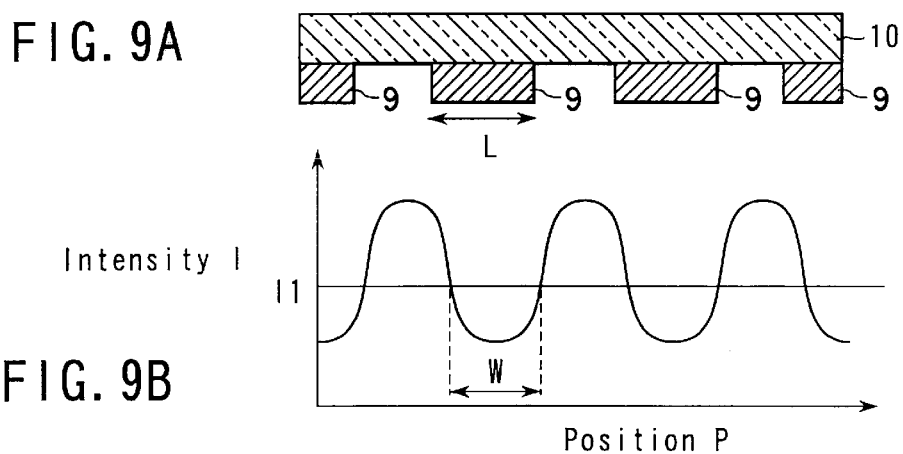
FIG. 9A
FIG. 9B
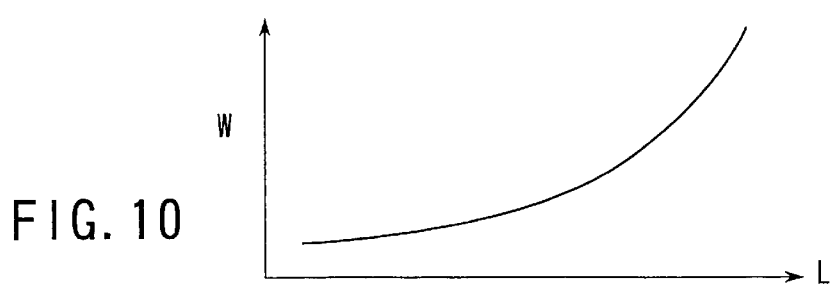
FIG. 10

EXPOSURE METHOD, EXPOSURE SYSTEM AND RECORDING MEDIUM

BACKGROUND OF THE INVENTION

1. Field of the Invention

The present invention relates to an exposure method and an exposure system used for a lithography process in a fabrication of a semiconductor device and a recording medium storing a program for executing by a computer a process in the exposure method and the exposure system.

2. Description of the Related Art

A film pattern forming process has been often used in the fabrication of the semiconductor device and it is an important process that has a great influence on the performance of a semiconductor element. The film pattern forming process comprises the steps of: forming a conductive film, an insulating film and the like on a semiconductor substrate (semiconductor wafer); coating a photoresist (photosensitive organic resin) film on the formed film; forming a photomask pattern in the photoresist film by exposing a light onto the photoresist film via a photomask; developing the photomask pattern to form the photoresist pattern corresponding to the photomask pattern; and etching the above described conductive or insulating film with this photoresist pattern as a mask to form a film pattern (LSI pattern). A process is used, which is referred to as a photolithography process, wherein photoresist is coated on a semiconductor substrate, a mask pattern is baked on the coated photoresist and the baked mask pattern is developed to form a predetermined photoresist pattern. In an exposing step, a photomask is used. The photomask is a transparent substrate made of, for example, silica, and a mask pattern made of, for example, chrome is formed on the upper surface of the photomask. The photomask is required to have high accuracy in order to obtain a highly accurate photoresist pattern.

Before a fresh photomask is used to expose a wafer to light, it is tested for its optimum exposure conditions (optimum exposure condition detection), as described below.

Conventionally, an exposure for the optimum exposure condition detection has been conducted according to a procedure shown in a process flow of FIG. 12. Specifically, an exposure is conducted onto a sample wafer via the fresh photomask, while changing the chip areas (exposed areas) and also changing the exposure dosage and focus, to form the photomask pattern on the photoresist film coated on the sample wafer. The photomask pattern formed on the photoresist film is developed to form the resist pattern on each chip area (step Si). FIG. 13 is a plan view of the sample wafer, showing a large number of exposure areas (chip areas). After development, a line width of the acquired resist pattern is measured by a scanning electron microscope and the like (step S2). In general, the measurement result is as shown in FIG. 14. Based on the measurement result, the optimum exposure conditions, that is, the optimum exposure, the optimum focus and the like, are obtained (step S3). Based on the obtained optimum conditions, an exposure is conducted for the practical wafers (step S4). These operations are conducted every time a fresh mask is used.

However, the above described optimum exposure condition detection operation has a large number of steps and is so complicated that an operation efficiency is extremely lowered.

BRIEF SUMMARY OF THE INVENTION

According to a first aspect of the present invention, there is provided an exposure method comprising exposing a light on a photomask having a mask pattern, in an exposing device; receiving in the exposing device the light which passed through the photomask to observe an optical image of the mask pattern based on the received light; deciding an optimum exposure condition based on the optical image of the mask pattern to form a predetermined resist pattern; and exposing a light on a photoresist film formed on a wafer via the photomask based on the optimum exposure condition.

According to a second aspect of the present invention, there is provided an exposure method comprising exposing a light on a photomask having a device pattern and a reference mark; receiving the light which passed through the photomask and observing an optical image of the reference mark based on the received light; inferring a dimension of the device pattern based on the observed optical image of the reference mark; deciding an optimum exposure condition for forming a predetermined resist pattern, based on the inferred dimension of the device pattern; and exposing a light on a photoresist film formed on a wafer via the photomask based on the optimum exposure condition.

According to a third aspect of the present invention, there is provided a system of exposing a light on a photomask having a mask pattern comprising an observing device in an exposure apparatus, which receives a light which passed through a photomask and observes an optical image of a mask pattern of the photomask based on the received light; a deciding device which decides an optimum exposure condition for forming a predetermined resist pattern, based on the optical image of the mask pattern; and an exposure apparatus which exposes a light on a photoresist film formed on a wafer via the photomask, based on the optimum exposure condition.

According to a fourth aspect of the present invention, there is provided a recording medium storing a program to be executed by a computer, the program including simulating a resist film based on an observed optical image of a mask pattern of a photomask obtained by receiving in an exposure apparatus a light which passed through the photomask and on a parameter showing a resist characteristic; inferring a dimension of the resist pattern based on the simulation; and deciding an optimum exposure condition based the inferred dimension of the resist pattern.

BRIEF DESCRIPTION OF THE SEVERAL VIEWS OF THE DRAWING

FIG. 7 is a plan view of a photomask according to a second embodiment of the present invention;

FIG. 8 is a graph of an image intensity distribution of an optical image of a reference mark formed on the photomask of FIG. 7;

FIG. 9A is a sectional view of a photo mask, and FIG. 9B is a graph of an image intensity distribution of the optical image of the photo mask;

FIG. 10 is a characteristic diagram showing a relation of line width (W) obtained from the image intensity distribution of the optical image for a photomask and dimension (L) of the reference mark;

DETAILED DESCRIPTION OF THE INVENTION

Hereinafter, embodiments of the present invention will be described with reference to the drawings.

A first embodiment will be described with reference to FIGS. 1 to 8.

Figure 1:
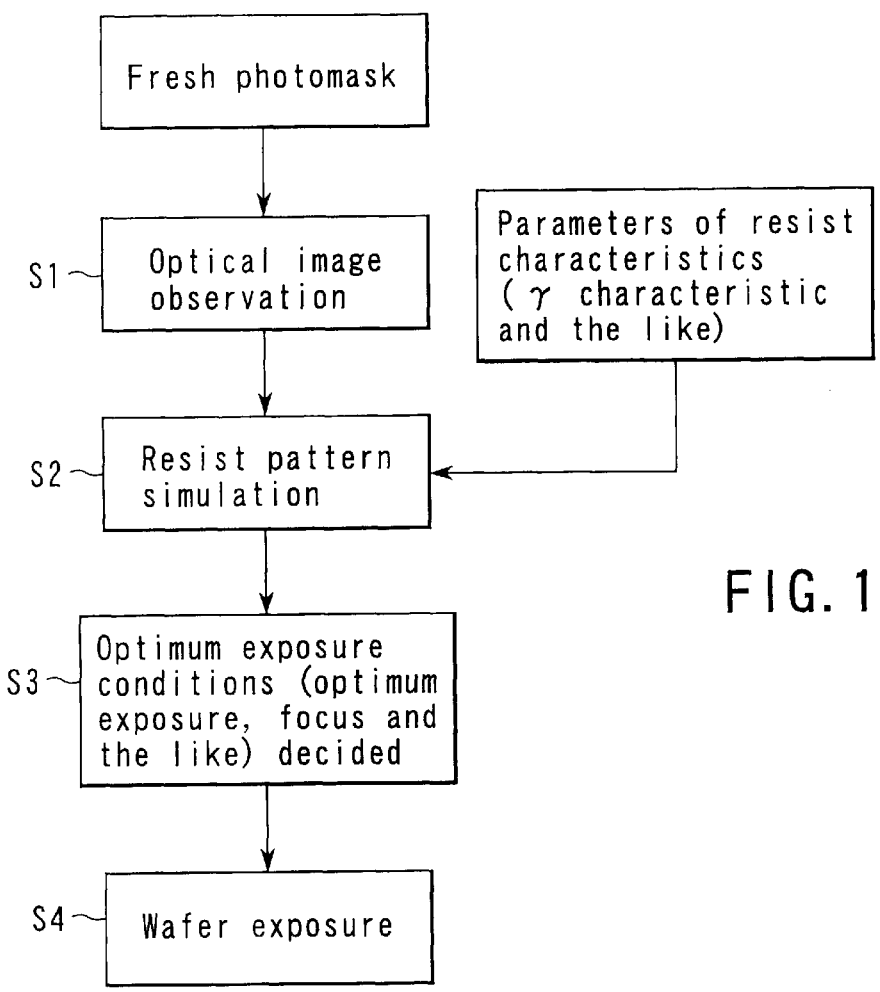
FIG. 1 shows a process flow of a resist pattern forming process according to a first embodiment of the present invention.

FIG. 1 shows a process flow of a resist pattern forming process according to the first embodiment of the present invention.

Before a fresh photomask is used to expose a wafer to light, it is tested for its optimum exposure conditions, as described below.

After the fresh photomask is set to an exposure apparatus, an exposure of a light is conducted via the photomask, and an optical image of the photomask is observed in the exposure apparatus, based on the light having passed through the photomask (step Si). Next, based on the observed optical image and the parameters of γ curve and the like showing the characteristic of the resist, the exposure conditions including the exposure, the focus and the like are changed to obtain a large number of resist patterns by a simulation (step S2). From the simulation result, the optimum exposure conditions in which a line width of the resist pattern is an target dimension, that is, the optimum exposure, the optimum focus and the like are detected (step S3). Based on the detected optimum exposure conditions, an exposure is conducted onto the wafer via the photomask (step S4).

Figure 2:
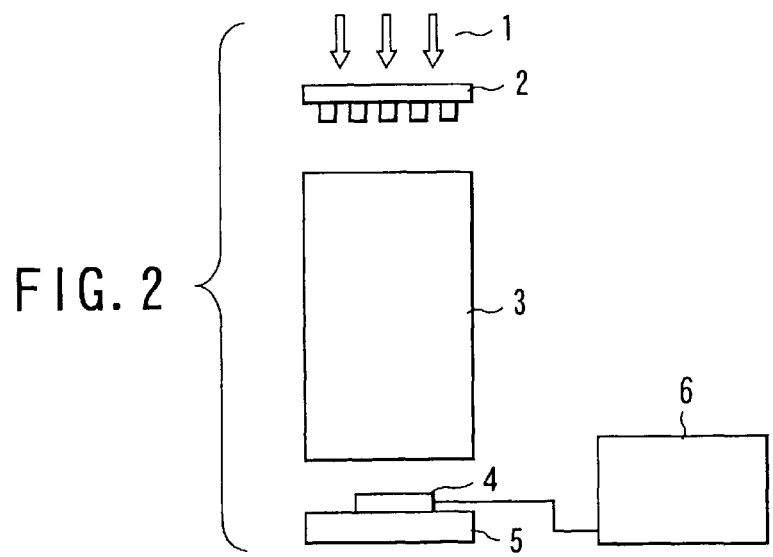
FIG. 2 is a schematic diagram of a configuration of an exposure apparatus according to the first embodiment of the present invention.
Figure 4:
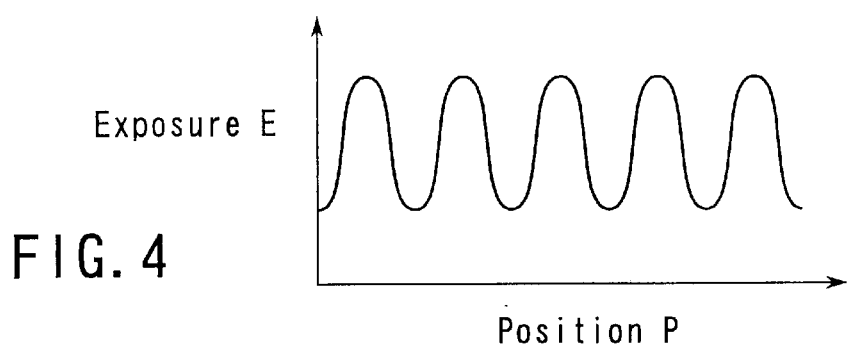
FIG. 4 is a graph of an exposure distribution based on the image intensity distribution shown in FIG. 3.
Figure 5:
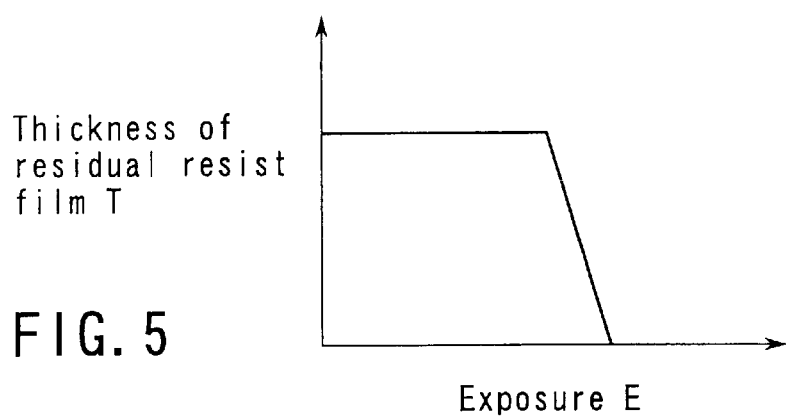
FIG. 5 is a graph of a characteristic diagram of a light sensitivity of a photoresist.
Figure 6:
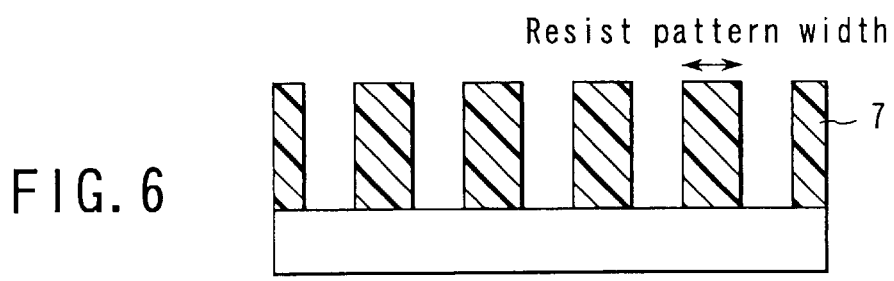
FIG. 6 is a sectional view of a resist pattern obtained by simulation.

Hereinafter, the description will be made in detail with reference to FIGS. 2 to 6. FIG. 2 is a schematic diagram of a configuration of an exposure apparatus according to the first embodiment of the present invention, FIG. 3 is a graph of an image intensity distribution of an optical image of a mask pattern by exposure to a photomask, FIG. 4 is a graph of an exposure distribution based on the image intensity distribution shown in FIG. 3, FIG. 5 is a graph of a characteristic diagram of a light sensitivity of a photoresist, and FIG. 6 is a sectional view of a resist pattern obtained by simulation.

First, a fresh photomask 2 is set on a reticle stage (not shown) in the exposure apparatus, and an exposure of a light 1 is irradiated onto the photomask 2. The light that passed through the photomask 2 (FIG. 2) is incident into a projection optical system 3 and is received by a CCD camera 4 mounted on a wafer supporting base or wafer stage 5 via the projection optical system 3 to observe an optical image of the pattern (photomask pattern) of the photomask 2. It is preferable that the light receiving surface of the CCD camera 4 mounted on the wafer supporting base 5 is located in the same plane as a surface of a resist film formed on a wafer (not shown) when the wafer is mounted on the wafer supporting base 5. This is because by doing so an optical image equal to an optical image appeared on the resist film surface when an exposure is conducted onto the wafer can be observed. With regard to the position which receives the optical image, it is not necessarily limited to the position of the wafer supporting base 5, but may be a position which is optically equivalent to the position of the wafer supporting base 5. In other words, an optical image equivalent to the optical image formed on the resist film surface may be received in a position different from the wafer stage position. For example, the optical projection system of the exposure apparatus may be re-structured so that the optical beam route is branched to provide an optical image via the branched optical beam route, and the optical image via the branched optical beam route may be received and observed at a different position from the wafer stage position. Instead of the exposure apparatus, a measuring device having an optical system equivalent to the exposure apparatus can be also used.

Figure 15:
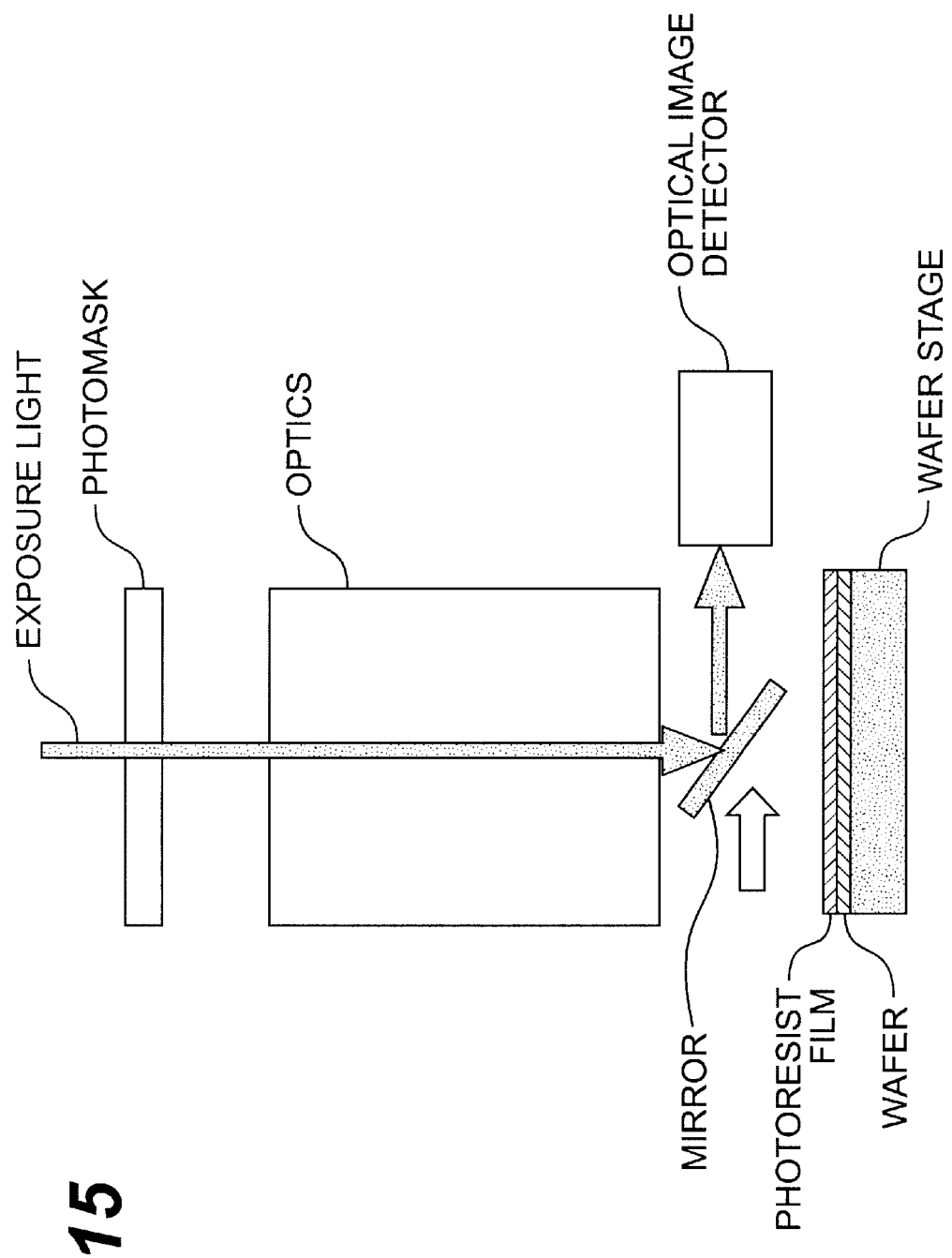
FIG. 15 illustrates a wafer and a condition in which light is received at a position optically equivalent to a photoresist film.

By way of example, FIG. 15 illustrates the wafer, and the condition in which light is received at a position optically equivalent to the photoresist film. In order that the light is received at a position optically equivalent to the photoresist film, the mirror is moved into the light path to reflect the light towards the optical image detector. By setting the light path length from the reflecting point to the optical image detector equal to that from the reflecting point to the photoresist film, the light is received by the optical image detector at a position optically equivalent to the photoresist film.

Figure 3:
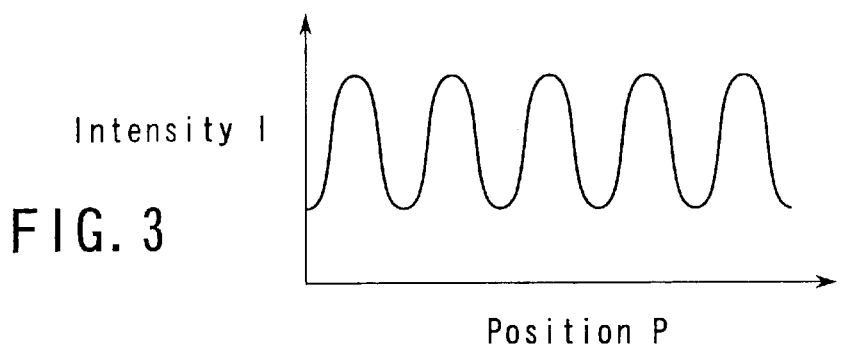
FIG. 3 is a graph of an image intensity distribution of an optical image of a mask pattern by exposure to a photomask.

Next, data of the observed optical image of the mask pattern is inputted into a data process computer 6 and a necessary processing is conducted to provide an image intensity distribution as shown in FIG. 3. The vertical axis of FIG. 3 indicates a light intensity (I) on the optical image, and the horizontal axis indicates a position (P) on the optical image. With regard to the data process computer 6, a mini-computer in the exposure apparatus may be used, or a computer which is on-line connected to the exposure apparatus may be used.

On the other hand, the computer is stored in advance with a γ curve data as shown in FIG. 5. The γ curve as shown in FIG. 5 indicates a sensitivity of the resist which receives the exposure. The optimum exposure to obtain the resist pattern of a predetermined line width is calculated by the computer based on the γ curve and the observed optical image.

The calculation by the computer is basically as follows:

First, the image intensity distribution of the optical image is multiplied by a certain amount of exposure to convert the image intensity distribution of the optical image of the mask pattern to the exposure distribution (FIG. 4). The vertical axis of FIG. 4 indicates an exposure (E), and the horizontal axis indicates a position (P) on the optical image. Next, the exposure distribution shown in FIG. 4 is converted to the resist pattern 7 shown in FIG. 6 according to the sensitivity curve (γ curve) of the resist shown in FIG. 5 and, then, the line width of the resist pattern 7 is obtained by measuring the resist pattern 7. While changing the exposure dosage by which the image intensity distribution of the optical image is multiplied, these steps are repeated to infer resist patterns obtained by the observed optical images. The optimum exposure conditions such as the optimum exposure, the optimum focus and the like are obtained based on the result of inferring. In the sensitivity curve of FIG. 5, the vertical axis indicates a resist film residual amount (T) and the horizontal axis indicates the exposure dosage(E).

Next, the wafer on the upper surface of which the resist film is coated is exposed via the photomask 2 by the optimum exposure obtained by the above procedure to form an image of the mask pattern 2 on the resist film. Then, the mask pattern image is developed to obtain a resist pattern. When the obtained resist pattern was measured by a CD (Critical Dimension)—SEM (Scanning Electronic Microscope), the obtained resist pattern had a desired dimension.

In this way, since the detection of the optimum exposure conditions is obtained by simulating the line width of the photoresist pattern, the detection operation of the optimum exposure conditions is simple and, further, the detection time is shortened in contrast to the conventional way, wherein the optimum exposure conditions were obtained by actually forming the photoresist pattern on the sample wafer.

Further, in the conventional method, wherein the photoresist pattern is actually formed on the sample wafer, due to the irregularity of the resist film thickness, development variation and the like, there is a possibility that the irregularity and/or the variation reflects on the detection result and, as a result, there is a possibility that the detected exposure conditions may not be optimum. On this point also, according to the detection method of this embodiment, since forming the mask pattern image on the resist film on the wafer is not accompanied, highly accurate optimum exposure conditions without being affected by the irregularity of the resist film thickness, the development variation and the like can be detected.

Next, a second embodiment of the present invention will be described with reference to FIGS. 7 to 10.

FIG. 7 is a plan view of a photomask according to a second embodiment of the present invention, FIG. 8 is a graph of an image intensity distribution of an optical image of a reference mark formed on the photomask of FIG. 7, FIG. 9A is a sectional view of a photo mask, and FIG. 9B is a graph of an image intensity distribution of the optical image of the photo mask, and FIG. 10 is a characteristic diagram showing a relation of line width (W) obtained from the image intensity distribution of the optical image for a photomask and dimension (L) of the reference mark.

A photomask 10 used in the exposure of this embodiment is shown in FIG. 7. The photomask 10 is characterized in that it is provided with reference marks 9. A device pattern 8 of a predetermined shape is formed in the center portion of the photomask 10, and the reference marks 9 are formed in its peripheral portion. It is desirable that the reference marks 9, as shown in FIG. 7, are provided across a whole area of the peripheral portion. The reference marks 9, as shown in FIG. 7, have a line and space pattern. In other words, a number of linear reference marks 9 are provided side by side at predetermined intervals on the photo mask at the peripheral portion around the device pattern 8. The device pattern 8 and the reference mark 9 of the photomask 10 are constituted by light proof material such as chrome and the like. Similarly to the first embodiment, for the fresh photomask 10, prior to its use in the exposure to the wafer, the use for obtaining optimum exposure conditions (the optimum exposure condition detection) is conducted. First, as shown in FIG. 1, a fresh photomask 10 is set on a reticle stage (not shown) in the exposure apparatus, and an exposure of a light 1 is irradiated onto the photomask 10. The light that passed through the photomask 10 is incident into the projection optical system 3 and is received by a CCD camera 4 mounted on a wafer supporting base or wafer stage 5 via the projection optical system 3 to observe an optical image of the reference mark 9 of the photomask 10. It is preferable that the light receiving surface of the CCD camera 4 mounted on the wafer supporting base 5 is located in the same plane as a surface of a resist film formed on a wafer (not shown) when the wafer is mounted on the wafer supporting base 5. This is because by doing so an optical image equal to an optical image appeared on the resist film surface when an exposure is conducted onto the wafer can be observed. With regard to the position which receives the optical image, it is not necessarily limited to the position of the wafer supporting base 5, but may be a position which is optically equivalent to the position of the wafer supporting base 5. In other words, an optical image equivalent to the optical image formed on the resist film surface may be received in a position different from the wafer stage position. For example, the optical projection system of the exposure apparatus may be re-structured so that the optical beam route is branched to provide an optical image via the branched optical beam route, and the optical image via the branched optical beam route may be received and observed at a different position from the wafer stage position. Instead of the exposure apparatus, a measuring device having an optical system equivalent to the exposure apparatus can be also used.

By way of example, FIG. 15 illustrates the wafer, and the condition in which light is received at a position optically equivalent to the photoresist film. In order that the light is received at a position optically equivalent to the photoresist film, the mirror is moved into the light path to reflect the light towards the optical image detector. By setting the light path length from the reflecting point to the optical image detector equal to that from the reflecting point to the photoresist film, the light is received by the optical image detector at a position optically equivalent to the photoresist film.

Next, data of the observed optical image of the reference mark is taken into a data process computer 6 and a necessary processing is conducted to provide an image intensity distribution as shown in FIG. 8. The vertical axis of FIG. 8 indicates a light intensity (I) on the optical image, and the horizontal axis indicates a position (P) on the optical image. The image intensity distribution shown in FIG. 8 shows the image intensity distribution of several reference marks 9 arranged side by side.

On the other hand, the relation between the width (W) (FIG. 9) obtained by slicing the image intensity distribution curve of the reference mark 9 at a predetermined strength of I1 and the dimension (L) (FIG. 9) of the reference mark 9 of the photomask 10 is obtained in advance and, for example, is as shown in FIG. 9.

Since the relation between the width (W) and the dimension (L) shown in FIG. 9 is such that, as the width W becomes larger, an increase ratio of the dimension L becomes larger, it is clear that the line width of the reference mark 9 of the photomask 10 used in this embodiment is larger than a design value by a certain value, for example, 20 nm. From this, it is assumed that the width of the device pattern 8 (FIG. 8) is larger than the design value by 20 nm. Based on this result, the optical image of the device pattern 8 is simulated. Then, the image of the device pattern 8 obtained by simulation is multiplied by a certain amount of exposure to convert the image intensity distribution of the optical image of the device pattern to the exposure distribution. Next, the exposure distribution of the device pattern is converted to the resist pattern by the simulation according to a sensitivity curve (γ curve) of the resist shown in FIG. 4 and, then, the line width of the resist pattern is obtained by measuring the resist pattern. While changing the exposure dosage by which the image intensity distribution of the optical image of the device pattern is multiplied, these steps are repeated to infer resist patterns obtained by the observed optical images. The optimum exposure conditions such as the optimum exposure, the optimum focus and the like are obtained based on the result of inferring.

Next, the wafer on the upper surface of which the resist film is coated is exposed via the photomask 10 by the optimum exposure obtained by the above procedure to form an image of the device pattern 8 of the photomask 10 on the resist film. Then, the image of the device pattern 8 is developed to obtain a resist pattern. When the obtained resist pattern was measured by a CD (Critical Dimension)—SEM (Scanning Electronic Microscope), the obtained resist pattern had a desired dimension.

In this embodiment, unlike the first embodiment, the intensity of the optical image of the device pattern is not observed. Instead, the reference mark 9 is provided in the peripheral part of the photomask 10 and the optical image of the reference mark 9 was observed. Since the accuracy of the reference mark 9 depends on the accuracy of the photomask 10, the line width of the device pattern 8 provided in the center part of the photomask 10 is assumed from the optical image of the reference mark 9. Based on the assumed line width, the optical image and the resist image of the device pattern are simulated to detect the optimum exposure conditions.

Figure 11:
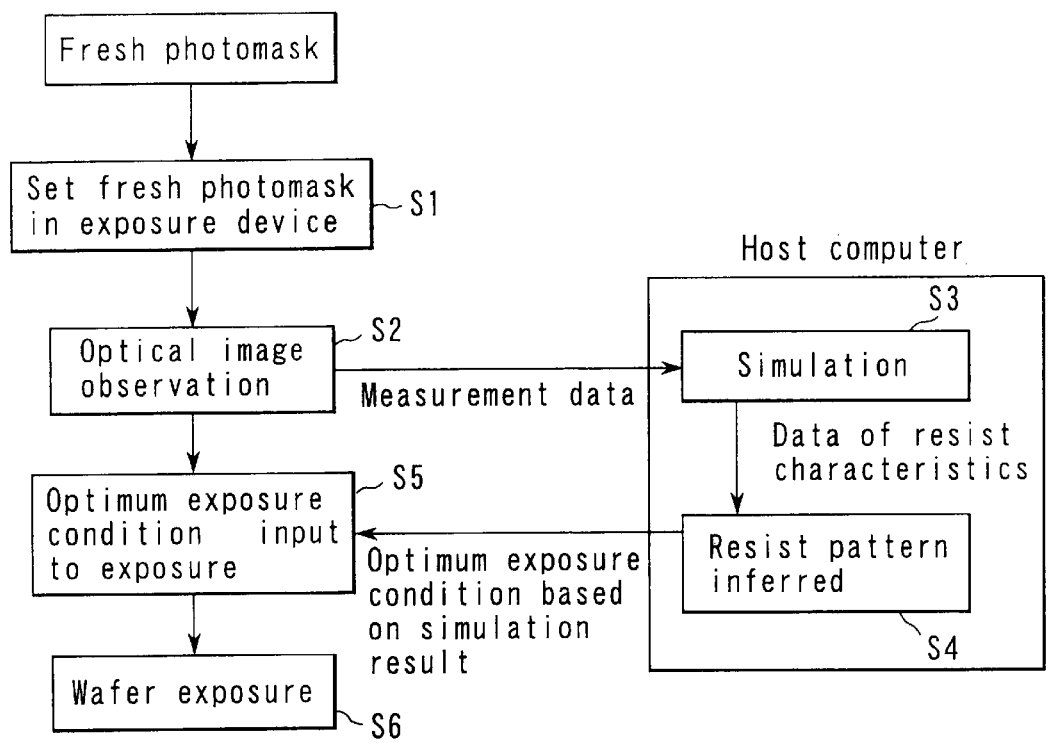
FIG. 11 shows a process flow of a resist pattern forming process, in which a process step by a computer is shown in detail.
Figure 12:
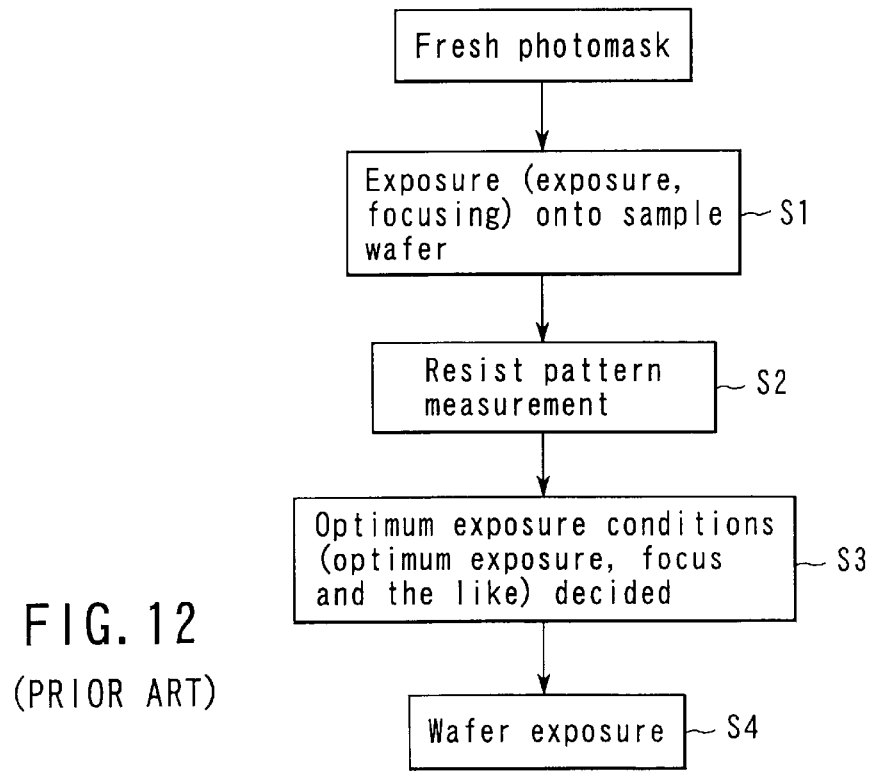
FIG. 12 is a view showing a process flow of the resist pattern forming process in the prior art.
Figure 13:
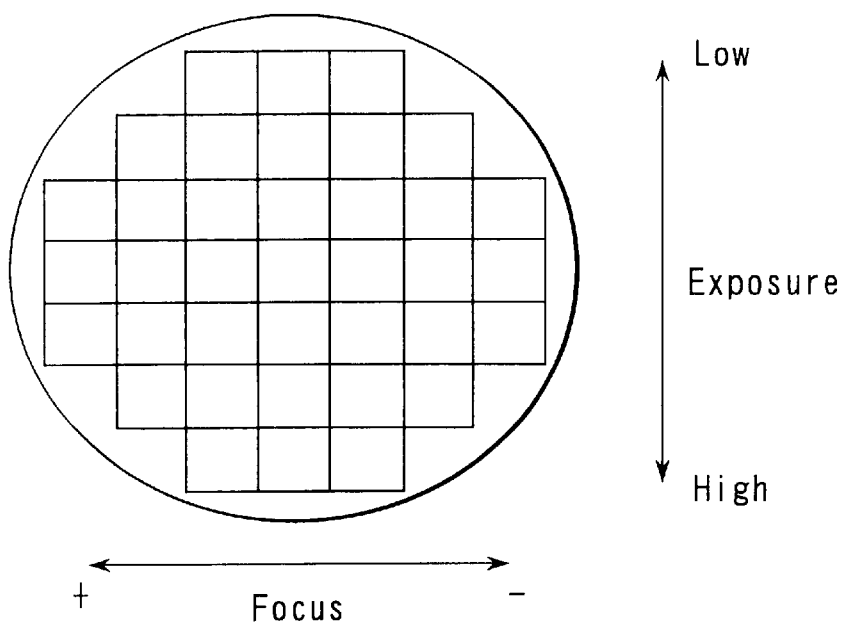
FIG. 13 is a plan view of a wafer.
Figure 14:
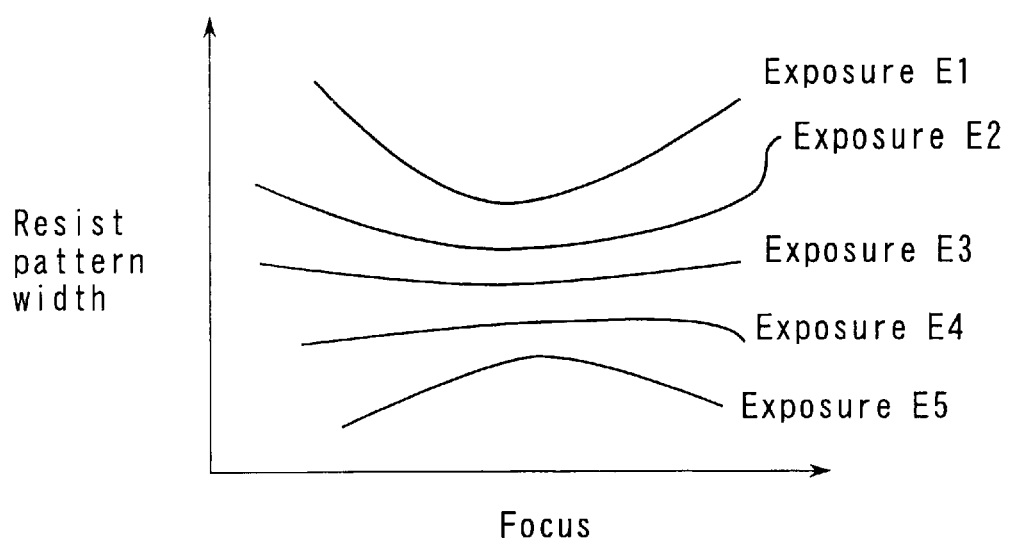
FIG. 14 is a characteristic diagram showing relations among the exposure to the resist pattern formed on the wafer, a focus and the line width of the resist pattern.

FIG. 11 shows a process flow of the resist pattern forming process, in which the process step by the computer is shown in detail.

First, a fresh photomask is set in the exposure apparatus (step S1). Next, the light from a light source is irradiated on the photomask to form an optical image of the mask pattern, and the optical image is observed in the exposure apparatus (step S2). Next, data of the observed optical image is inputted to the computer and a resist pattern is provided through simulation by the computer based on the optical image data and the parameter of a γ curve and the like showing a characteristic of the resist which is stored in advance in the computer (step S3). A shape of the device pattern of the photomask is inferred based on the resist pattern obtained by simulation, and, the resist pattern formed into the wafer is inferred based on the shape of the assumed device pattern to detect the optimum exposure conditions such as the optimum exposure, the focus and the like (step S4). The optimum exposure conditions detected by the computer are inputted to the exposure apparatus (step S5). Next, a resist pattern is formed on the wafer based on the exposure conditions (step S6).

The processes shown in FIGS. 1 and 11 can be stored in a recording medium readable by a computer. The above described exposure method in each embodiment can be realized by reading the process flow from the recording medium and inputting the process flow into the computer for execution by the computer. Any memory device which can store programs, for example, a memory device, a magnetic disc device, an optical disc device and the like are included in the recording medium.

As described above, the process in the conventional method, that is, the process wherein the sample wafer is exposed, the photoresist pattern is actually formed on the resist film formed on the wafer and the formed photoresist pattern is measured, is not included in the detection of the optimum exposure conditions according to the embodiments of the present invention. In the embodiments of the present invention, the optimum exposure conditions are detected by observing the optical image of the mask pattern and by simulating the line width of the photoresist pattern based on the optical image of the observed mask pattern. Accordingly, in the embodiments of the present invention, the detection operation is simple and the detection time is shortened, thereby improving detection efficiency.

Further, in the conventional method, wherein the photoresist pattern is actually formed on the sample wafer, due to the irregularity of the resist film thickness, development variation and the like, there is a possibility that the irregularity and/or the variation reflects on the detection result and, as a result, there is a possibility that the detected exposure conditions may not be optimum. On this point also, according to the detection method of this embodiment, since forming the mask pattern image on the resist film on the wafer is not accompanied, highly accurate optimum exposure conditions without being affected by the irregularity of the resist film thickness, the development variation and the like can be detected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:
   exposing a light on a photomask having a mask pattern, in an exposing device;
   receiving in said exposing device the light which passed through said photomask to observe an optical image of said mask pattern based on the received light;
   deciding an optimum exposure condition based on said optical image of the mask pattern to form a predetermined resist pattern; and
   exposing a light on a photoresist film formed on a wafer via said photomask based on said optimum exposure condition,
   wherein deciding said optimum exposure condition is conducted by inferring a dimension of a resist pattern obtained based on said optical image,
   and wherein inferring the dimension of said resist pattern obtained based on said optical image is conducted by simulating the resist pattern obtained based on said optical image and measuring the dimension of the simulated resist pattern.

2. The exposure method according to claim 1, wherein inferring the dimension of said resist pattern is conducted by using a parameter showing a sensitivity characteristic of a resist material of the resist pattern.

3. The exposure method according to claim 1, wherein deciding said optimum exposure condition is conducted via an execution by means of a computer.

4. The exposure means according to claim 3, wherein a sensitivity characteristic of a resist material of the photoresist film is stored in the computer and data of said optical image of said mask pattern is inputted to the computer.

5. The exposure method according to claim 1,
   wherein the light which passed through said photomask is received at a position in the exposing device where a surface of said photoresist film is to be positioned.

6. The exposure method according to claim 1, wherein the light which passed through said photomask is received at a position in the exposing device which is optically equivalent to a position where a surface of said photoresist film is to be positioned.

7. An exposure method comprising:

exposing a light on a photomask having a device pattern and a reference mark;

receiving the light which passed through said photomask and observing an optical image of said reference mark based on the received light;

inferring a dimension of said device pattern based on the observed optical image of said reference mark;

deciding an optimum exposure condition for forming a predetermined resist pattern, based on the inferred dimension of said device pattern; and exposing a light on a photoresist film formed on a wafer via said photomask based on said optimum exposure condition, wherein inferring the dimension of said device pattern is conducted by observing the optical image of said reference mark of said photomask, and inferring the dimension of the device pattern based on the observed optical image.

8. The exposure method according to claim 7, wherein deciding said optimum exposure condition is conducted via an execution by means of a computer.

9. The exposure means according to claim 8, wherein a sensitivity characteristic of a resist material of the photoresist film is stored in the computer and data of said optical image is inputted to the computer.

10. The exposure method according to claim 7, wherein the light which passed through said photomask is received at a position in an exposing device where a surface of said photoresist film is positioned.

11. The exposure method according to claim 7, wherein the light which passed through said photomask is received at a position in an exposing device which is optically equivalent to a position where a surface of said photoresist film is positioned.

12. The exposure method according to claim 7, wherein said reference mark is provided on said photomask in a peripheral part of said device pattern.

13. The exposure method according to claim 7, wherein a plurality of said reference marks are provided and the reference marks are patterned in a form of line and space.

14. A recording medium storing a program to be executed by a computer, the program including:

simulating a resist film based on an observed optical image of a mask pattern of a photomask obtained by receiving in an exposure apparatus a light which passed through said photomask and on a parameter showing a resist characteristic;

inferring a dimension of the resist pattern based on the simulation; and deciding an optimum exposure condition based the inferred dimension of said resist pattern.

* * * * *

UNITED STATES PATENT AND TRADEMARK OFFICE
CERTIFICATE OF CORRECTION

PATENT NO. : 6,741,334 B2
DATED : May 25, 2004
INVENTOR(S) : Asano et al.

It is certified that error appears in the above-identified patent and that said Letters Patent is hereby corrected as shown below:

Column 10,
Line 27, change "based the" to -- based on the --.

Signed and Sealed this

Twenty-sixth Day of October, 2004

JON W. DUDAS
*Director of the United States Patent and Trademark Office*